US009280434B2

(12) United States Patent
Kube et al.

(10) Patent No.: US 9,280,434 B2
(45) Date of Patent: *Mar. 8, 2016

(54) TESTING AND MITIGATION FRAMEWORK FOR NETWORKED DEVICES

(75) Inventors: Nathan John Walter Kube, Vancouver (CA); Daniel Malcolm Hoffman, Victoria (CA); Frank Markus, Surrey (CA)

(73) Assignee: Wurldtech Security Technologies, Vancouver (CA)

( * ) Notice: Subject to any disclaimer, the term of this patent is extended or adjusted under 35 U.S.C. 154(b) by 1002 days.

This patent is subject to a terminal disclaimer.

(21) Appl. No.: 13/423,004
(22) Filed: Mar. 16, 2012
(65) Prior Publication Data

US 2012/0265490 A1 Oct. 18, 2012
US 2015/0121143 A9 Apr. 30, 2015

Related U.S. Application Data

(63) Continuation of application No. 13/198,663, filed on Aug. 4, 2011, now Pat. No. 9,026,394, which is a
(Continued)

(51) Int. Cl.
 *G06F 11/263* (2006.01)
 *G01R 31/3181* (2006.01)
(Continued)

(52) U.S. Cl.
 CPC .......... *G06F 11/263* (2013.01); *G01R 31/3181* (2013.01); *G05B 23/0256* (2013.01);
(Continued)

(58) Field of Classification Search
 CPC .......... G01D 7/00; G01D 9/00; G01D 21/00; G01R 31/00; G01R 31/28; G01R 31/316; G01R 31/3161; G01R 31/317; G01R 31/31707; G01R 31/3181; G01R 31/3183; G01R 31/318307; G05B 23/00; G05B 23/02; G05B 23/0205; G05B 23/0218; G05B 23/0256; G06F 11/00; G06F 11/07; G06F 11/22; G06F 11/26; G06F 11/263; G06F 11/28; G06F 11/113; G06F 11/32; G06F 11/34; G06F 11/36; G06F 11/3668; G06F 11/3672; G06F 11/3684; G06F 11/3688; G06F 11/3692; G06F 15/00; G06F 15/16;
G06F 17/00; G06F 17/10; G06F 17/40; G06F 19/00
 USPC ........................ 73/432.1, 865.8, 865.9, 866.3; 324/73.1, 500, 537, 759.01; 702/1, 33, 702/34, 57, 58, 108, 117, 119, 122, 123, 702/127, 182, 186, 187, 189; 714/1, 2, 3, 714/25, 37, 100, E11.001, E11.002, 714/E11.02, E11.178, E11.179, E11.207; 717/100, 124, 127, 131
See application file for complete search history.

(56) References Cited

U.S. PATENT DOCUMENTS 2,883,255 A * 4/1959 Anderson ....................... 346/34
3,082,374 A 3/1963 Buuck
(Continued)

FOREIGN PATENT DOCUMENTS

CN 11094118 A 12/2007
WO WO 2006/106502 A1 10/2006
(Continued)

OTHER PUBLICATIONS

Auguston et al., Using Attributed Event Grammar Environment Models for Automated Test Generation and Software Risk Assessment of Systems-of-Systems, Systems, Man and Cybernetics, 2005 IEEE International Conference, Oct. 10-12, 2005, vol. 2, pp. 1870-1875.
(Continued)

*Primary Examiner* — Edward Cosimano
(74) *Attorney, Agent, or Firm* — Knobbe, Martens, Olson & Bear, LLP

(57) ABSTRACT

The present disclosure generally relates to the automated testing of a system that includes software or hardware components. In some embodiments, a testing framework generates a set of test cases for a system under test using a grammar. Each test case may perform an action, such as provide an input to the system under test, and result in an output from the system under test. The inputs and outputs are then compared to the expected results to determine whether the system under test is performing correctly. The data can then be interpreted in the grammar system or used as input to a fault isolation engine to determine anomalies in the system under test. Based on identified faults, one or more mitigation techniques may be implemented in an automated fashion.

40 Claims, 7 Drawing Sheets

Related U.S. Application Data continuation-in-part of application No. 12/395,363, filed on Feb. 27, 2009, now Pat. No. 8,433,542, and a continuation-in-part of application No. 12/247,157, filed on Oct. 7, 2008, now Pat. No. 8,006,136.

(60) Provisional application No. 60/978,364, filed on Oct. 8, 2007, provisional application No. 61/077,458, filed on Jul. 1, 2008, provisional application No. 61/032,046, filed on Feb. 27, 2008, provisional application No. 61/077,459, filed on Jul. 1, 2008.

(51) Int. Cl.
*G06F 11/36* (2006.01)
*G06F 17/40* (2006.01)
*G05B 23/02* (2006.01)
*G06F 11/34* (2006.01)
*G06F 11/30* (2006.01)

(52) U.S. Cl.
CPC ........ *G06F11/3006* (2013.01); *G06F 11/3409* (2013.01); *G06F 11/3684* (2013.01); *G06F 11/30* (2013.01); *G06F 11/36* (2013.01); *G06F 17/40* (2013.01)

(56) References Cited

U.S. PATENT DOCUMENTS

| | | |
|---|---|---|
| 3,219,927 A | 11/1965 | Topp, Jr. et al. |
| 4,034,195 A * | 7/1977 | Bates .............................. 714/46 |
| 5,553,059 A * | 9/1996 | Emerson et al. ............. 370/248 |
| 5,724,273 A | 3/1998 | Desgrousilliers et al. |
| 5,913,023 A | 6/1999 | Szermer |
| 6,125,457 A | 9/2000 | Crisan et al. |
| 6,195,616 B1 | 2/2001 | Reed et al. |
| 6,202,186 B1 | 3/2001 | Oonk |
| 7,290,193 B2 | 10/2007 | Kadkade et al. |
| 7,340,364 B1 | 3/2008 | Kumaki |
| 7,343,587 B2 | 3/2008 | Moulden, Jr. et al. |
| 7,480,900 B1 | 1/2009 | Zhou et al. |
| 8,006,136 B2 | 8/2011 | Kube et al. |
| 8,132,053 B2 | 3/2012 | Kube et al. |
| 8,433,542 B2 * | 4/2013 | Kube et al. .................... 702/186 |
| 8,788,996 B2 * | 7/2014 | Diamond et al. ............. 716/117 |
| 9,026,394 B2 * | 5/2015 | Kube et al. .................... 702/123 |
| 2001/0054174 A1 | 12/2001 | Boggs et al. |
| 2003/0016738 A1 | 1/2003 | Boolos et al. |
| 2003/0033404 A1 | 2/2003 | Richardson et al. |
| 2003/0051163 A1 | 3/2003 | Bidaud |
| 2005/0251761 A1 * | 11/2005 | Diamond et al. ................ 716/1 |
| 2006/0090100 A1 | 4/2006 | Holzapfel et al. |
| 2006/0184928 A1 | 8/2006 | Hughes |
| 2007/0220342 A1 | 9/2007 | Vieira et al. |
| 2008/0059106 A1 | 3/2008 | Wight et al. |
| 2008/0086660 A1 | 4/2008 | Wefers |
| 2008/0115112 A1 | 5/2008 | Sharma |
| 2008/0120521 A1 | 5/2008 | Poisson et al. |
| 2008/0184206 A1 | 7/2008 | Vikutan |
| 2009/0204848 A1 * | 8/2009 | Kube et al. ..................... 714/25 |
| 2009/0254312 A1 | 10/2009 | Kube et al. |
| 2012/0173931 A1 * | 7/2012 | Kube et al. ..................... 714/37 |

FOREIGN PATENT DOCUMENTS

| | | |
|---|---|---|
| WO | WO 2006/106502 A2 | 10/2006 |
| WO | WO 2009/046525 A1 | 4/2009 |

OTHER PUBLICATIONS

Bird, D.L., and C.U. Munoz, Automatic Generation of Random Self-Checking Test Cases, IBM Systems Journal, 1983, vol. 22, Issue 3, pp. 229-245.

Dalal, S.R., et al., Model-Based Testing of a Highly Programmable System, Proceedings of the Ninth Symposium on Software Reliability Engineering, Nov. 4-7, 1998, pp. 174-179.

Hanford, K.V., Automatic Generation of Test Cases, IBM Systems Journal, vol. 9, Issue 4, pp. 242-257, 1970.

Lammel, R., and W. Schulte, Controllable Combinatorial Coverage in Grammar-Based Testing, Proceedings of the 18th IFIP TC6/WG6.1 International Conference, TestCom 2006, New York, New York, May 16-18, 2006.

Sirer, E.G., and B.N. Bershad, Using Production Grammars in Software Testing, Second Conference on Domain Specific Languages, Austin, Texas, Oct. 3-5, 1999, pp. 1-13.

Using Attributed Event Grammar Environment Models for Automated Test Generation and Software Risk Assessment of System-of-Systems, Systems, Man and Cybernetics, 2005 IEEE International Conference, vol. 2, pp. 1870-1875.

\* cited by examiner

TESTING AND MITIGATION FRAMEWORK FOR NETWORKED DEVICES

CROSS-REFERENCE TO RELATED APPLICATIONS

This application is a continuation of U.S. patent application Ser. No. 13/198,663, entitled "Testing and Mitigation Framework for Networked Devices," filed Aug. 4, 2011, now U.S. Pat. No. 9,026,394, which is a continuation-in-part of U.S. patent application Ser. No. 12/395,363, entitled "Testing Framework for Control Devices," filed Feb. 27, 2009, now U.S. Pat. No. 8,433,542, which claims the benefit of expired U.S. Provisional Patent Application No. 61/032,046, entitled "Test Bench for Control Devices," filed Feb. 27, 2008, and expired U.S. Provisional Patent Application No. 61/077,459, entitled "Testing Framework For Control Devices," filed Jul. 1, 2008, and is a continuation-in-part of U.S. patent application Ser. No. 12/247,157, entitled "Automatic Grammar Based Fault Detection and Isolation," filed Oct. 7, 2008, now U.S. Pat. No. 8,006,136, which claims the benefit of expired U.S. Provisional Patent Application No. 60/978,364, entitled "System and Methods for Automated Grammar Based Fault Discovery and Isolation," filed Oct. 8, 2007, and expired U.S. Provisional Patent Application No. 61/077,458, entitled "Automatic Grammar Based Fault Detection and Isolation," filed Jul. 1, 2008, the entireties of which are incorporated herein by reference.

BACKGROUND

Generally described, computing devices can be utilized in a variety of contexts, such as for exchanging information, facilitating communication between users, facilitating the operation and control of a wide variety devices and processes, and the like. In the context of a manufacturing or production environment, a computing network made up of a number of computing devices, including personal computing devices, server computing devices, programmable logic controllers (PLCs), or other networked devices can be utilized in conjunction with a communication network, such as the Internet, to facilitate the operation and control of various devices/processes. For example, a networked PLC may be utilized to control the operation of physical manufacturing or processing equipment, such as controllers for valves, power supplies, pumps, machinery, etc. Similarly, a software application, or suite of software applications, may be hosted on a networked computing device, such as a server or personal computing device, to receive instructions regarding the operation of various equipment and transmit respective instructions to the appropriate equipment, such as through a PLC.

A fault in one or more networked computing devices, such a fault in a computing device, can lead to the failure of associated equipment, loss of manufacturing/production time, property damage, and the like. Accordingly, manufacturing/production computing networks, including hardware and software aspects, can be designed with redundant components to avoid fault conditions during execution in a manufacturing/production environment. For example, a PLC may include a "fail safe" mode such that in the event of a fault, the outputs from the PLC mitigate potential damage to attached equipment or errant instructions that could cause additional faults/damage.

Computing systems can be tested to verify that requirements for safety and redundancy are met and to discover errors in design/implementation. For example, a testing system can be implemented, such as in a laboratory, that attempts to emulate various commands, instructions, or other environmental information over a network, and then measure the response generated by the computing device(s) being tested, generally referred to as the "device under test" or "system under test." The emulated commands, instructions, or other environment information can be embodied as a test case or testing procedure that can be executed by a testing system. More specifically, in one aspect, the generation of test cases or testing procedures for computing device testing involves the utilization of testing grammars from which test cases/testing procedures can be derived. Generally described, grammar based test generation involves specifying a grammar which describes a language consisting of a set of strings. The grammar can be processed by a testing system and utilized to derive test cases corresponding to strings in the language specified by the grammar.

BRIEF DESCRIPTION OF THE DRAWINGS

The present disclosure will now be described in detail below in connection with the following figures in which.

DETAILED DESCRIPTION

Figure 1A:
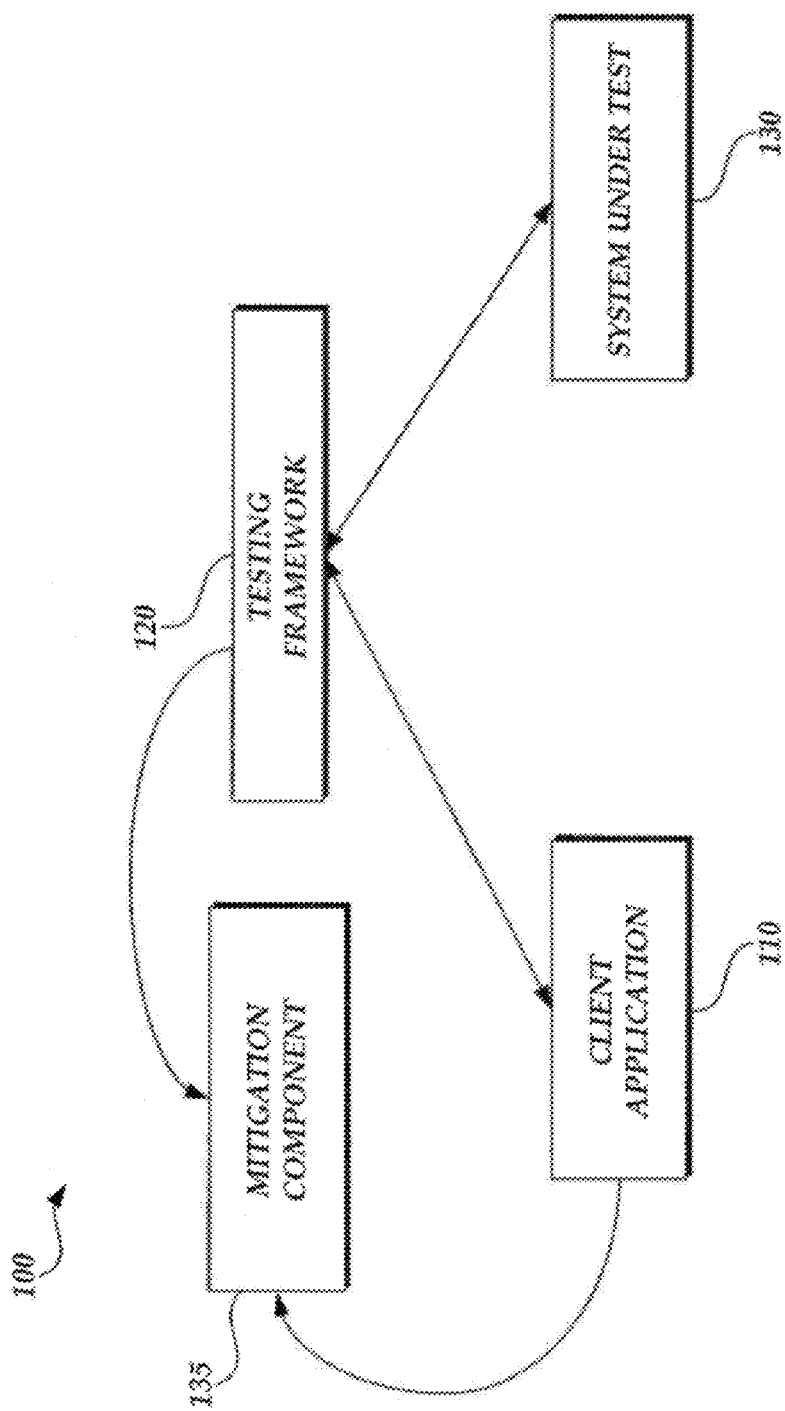
FIG. 1A illustrates a block diagram of an exemplary system capable of automatically generating grammar tags, according to an embodiment of the disclosure.

This disclosure generally relates to testing and testing frameworks. More specifically, one aspect of the present disclosure relates to systems and methods for providing a testing framework for a system under test. In some embodiments, the testing framework can be used to assess the robustness of process control devices through the monitoring of outputs from one or more components in a testing environment that are typically considered inputs to a system under test. Additionally, the testing framework can assess the robustness of process control devices through monitoring of outputs responsive to a testing sequence (e.g., a series of test cases) provided by the testing framework. The monitored outputs are generated by the system under test and collected by the testing framework.

In accordance with an illustrative embodiment, the testing framework can be used to assess specific vulnerabilities and security threats to control system devices and networks. The present disclosure may be particularly beneficial for systems, such as process control and supervisory control and data acquisition (SCADA) systems, that have traditionally used closed proprietary architectures. The present disclosure may also be beneficial for systems that utilize Internet Protocol ("IP")-based data protocols transmitted over private or public communication networks, such as intranets or the Internet. While illustrative examples may be discussed in various aspects of the present disclosure, one skilled in the relevant art will appreciate that the disclosed testing framework, operating environment, test cases, and grammars are illustrative in nature and should not be construed as limiting. Additionally, the present disclosure should not be construed to be limited as applicable only to any particular system under test and that all disclosed embodiments are also illustrative in nature, In another aspect of the present disclosure, the testing framework modifies an existing grammar or creates a new grammar by controlling grammar attribute tags. The modification may be based, at least in part, on feedback received from the processing of a previous set of test cases generated from a current grammar. In such embodiments, the modification of the current grammar can correspond to the modification of attribute tags in the current grammar that results in the selection and creation of a subset of test cases generated by the current grammar. In an embodiment, a method is provided that generates a new set of grammars by automatically modifying or inserting tags in an original grammar (e.g., the current grammar). The automatic modification or insertion is based on feedback obtained from the system under test or device under test from inputs corresponding to the previous set of test cases.

Still further, in another aspect of the present disclosure, one or more identified vulnerabilities in the system under test can be identified by processing one or more sets of test cases, as described above. Once a vulnerability or fault is identified, the identified vulnerability can be utilized in conjunction with various mitigation techniques. In one embodiment, identified vulnerabilities in the system under test can be processed to identify the grammar production that resulted in the production of the fault. For example, the grammar production that resulted in the data packets that created the fault when transmitted to the system under test. The identified grammar production can then be used to generate rule sets, masks, or other information utilized by devices, such as firewalls, to prevent the exploitation of the identified vulnerabilities, e.g., prevent the execution/processing of the identified grammar production. One skilled in the relevant art will appreciate that additional or alternative mitigation techniques may also be implemented in accordance with this aspect.

Embodiments of the disclosure will now be described with reference to the accompanying figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Exemplary Description of Context Free Grammars

Generally described, context-free grammars relate to mathematical formalism for generating and recognizing constituents of a natural language, can be otherwise referred to as Backus-Naur Form. In accordance with the present disclosure, bits in a network packet can be modeled as symbols or letters of the alphabet of a natural language to obtain an equivalence between the fields of a network packet and the words of a natural language. Each field of a network packet is a specific grouping and ordering of symbols. Additionally, an equivalence can be obtained between messages from a network communication protocol and sentences from a natural language. Thus, a mathematical formalism such as a context-free grammar that is applicable for generation and recognition of sentences of a natural language is applicable as well for generation and recognition of messages from a network communication protocol.

The use of a context-free grammar for generation of messages from a network communication protocol is useful from the perspective of generation of series of test cases that are to be sent to a system under test. The ability of a context-free grammar to recognize messages from a network communication protocol allows for determining whether a system under test is responding correctly to various test cases, and thus whether the system under test is exhibiting signs of vulnerability. Illustratively, a context-free grammar G is defined as a 4-tuple $G=(N, T, P, S)$. N is a set of non-terminal symbols, which are clusters or generalizations of terminal symbols that lie in T. Terminal symbols are symbols that form actual words in a natural language or their equivalent in another context. For example, the terminal symbols in the context-free grammar that defines the English language are the letters of the English alphabet. Examples of non-terminal symbols include Determiner, Noun, Adjective, etc. The terminal symbols in the Context-free grammar that defines a network communication protocol such as Ethernet/IP are bits. Examples of non-terminal symbols in Ethernet/IP include Encapsulation Header and Command Specific Data, which are clusters of generalizations of various fields that form an Ethernet/IP message.

P is a set of productions, i.e., rules, which express specific ways that symbols of a Context-free grammar can be grouped and ordered together. In each production, the item on the left of the arrow is a single non-terminal symbol, while the item on the right of the arrow is an ordered list of one or more terminal symbols and/or non-terminal symbols. The following are examples of productions in the context-free grammar that defines "the language" of Ethernet/IP messages:

Ethernet/IP_Message→EncapsulationHeader CommandSpecificData
EncapsulationHeader→Command Length Session Status Context Options
Command→0000000001100101

In the case a context-free grammar is used as a language generator, sentences of a natural language or messages of a network communication protocol are obtained by applying productions starting from S, which is referred to as designated start symbol. Clearly S is a non-terminal symbol. The sequence of productions whose applications starting from S lead to a constituent of the language defined by the context-free grammar, such as a natural language sentence or Ethernet/IP message, is referred to as derivation and forms a parse tree. The language defined by the Context-free grammar is the set of sequences of terminal symbols that are derivable from the designated start symbol.

When a context-free grammar is used for language recognition, pertinent productions are applied in the opposite direction with respect to the previous case, and thus reconstruct the parse tree in a bottom-up approach, i.e., from the leaves towards the root. Sequences of terminal symbols that can be derived by a context-free grammar are said to be grammatical and hence are in the language defined by that context-free grammar. A sequence of terminal symbols, such as an Ethernet/IP message, is said to be recognizable by a context-free grammar if it is grammatical with respect to that context-free grammar. A sequence of terminal symbols that cannot be derived by a context-free grammar is referred to as ungrammatical, and thus is not in the language defined by that context-free grammar. A sequence of terminal symbols is said to be unrecognizable by a context-free grammar if it is ungrammatical with respect to that context-free grammar.

Exemplary System Under Test

FIG. 1A illustrates a block diagram of an exemplary system 100 capable of initiating and processing a test sequence for a system under test. As shown, a client application 110 communicates with a testing framework 120. Testing framework 120 may communicate with system under test 130.

Communication within the system may take place over a network using sockets, ports, and other mechanisms recognized in the art. In an illustrative embodiment, communication between the client application 110, the testing framework 120, and the system under test 130 may be facilitated through a standardized communication protocol, such as the Object-Linking and Embedding (OLE) for Process Control standard, generally referred to as "OPC." The communication may also be via wire(s), cable(s), flex circuit(s), wireless technologies, or other suitable analog or digital communication methodologies and devices to perform those methodologies. Client application 110, testing framework 120, and system under test 130 may reside on physically separate machines, such as computers. Additionally, at least some combination of the client application 110, testing framework 120, or system under test 130 may be implemented on the same computing device. In one embodiment, at least some portion of the client application 110 or testing framework may be emulated through the utilization of virtualization technologies or network based services. Still further, although client application 110 and testing framework 120 are illustrated in a client-server model in which the client application 110 transmits commands to the testing framework 120, one skilled in the relevant art will appreciate that the system 100 may be implemented in a peer-to-peer network embodiment. In such an embodiment, the testing framework 120 and client application 110 may exchange commands via bilateral communications.

Client application 110 may be an application running on a computing device that allows a user to select configuration and test procedures to run on system under test 130. In an embodiment, where client application resides on a computer separate from testing framework 120, client application 110 may send data to testing framework 120 that specifies the user selected configuration and test procedures to run. After tests have been run on system under test 130, client application 110 can receive results from testing framework 120 and generate reports based on the results. In an alternative embodiment, the client application 110 may be hosted as a network-provided service.

Testing framework 120 may be an application running on a computer server that generates and executes tests on system under test 130 based on the configuration and test procedures selected by the user with client application 110. For example, testing framework 120 can include a web service component running on a computer server or distributed across one or more computers and operative to exchange information via an application programming interface ("API"). When test results are received from system under test 130, testing framework 120 may refine a testing strategy and create a second set of tests that are broader or narrower than the original tests run on system under test 130. Illustrative methods for generating additional testing grammars by the testing framework 120 will be described below.

System under test 130 may comprise a computer program, hardware device, and/or a combination of one or more hardware device(s) and computer program(s). For example, the system under test 130 can include an operating system or software application. In another example, the system under test 130 may be a hardware device, such as a programmable logic controller or supervisory control and data acquisition system. As previously discussed, the system under test 130 may be a combination of hardware or software components, such as a computing device executing one or more computer programs. In some embodiments, the system under test 130 may be a database, user interface, computer network, and embedded or industrial device. One skilled in the relevant art will appreciate that additional or alternative configurations of the system under test 130 will be considered to be within the scope of the present disclosure. Illustratively, the system under test 130 may correspond to a specific configuration of one or more computing or communication devices. Accordingly, in one embodiment, the system under test 130 may correspond to the combination of multiple computing and communication devices based on actual or proposed implementations. In another embodiment, the system under test 130 may correspond to individualized components or specific combination of components to assess vulnerabilities or performance of the individual components.

With continued reference to FIG. 1A, the exemplary system 100 also includes a mitigation component 135, or mitigation components 135, that utilize vulnerabilities or faults identified by the testing framework 120. In an illustrative embodiment, the mitigation component 135 can process vulnerability or fault information in order to derive the corresponding grammar production, which may be then used to configure computing devices, such as firewalls, to filter, or prohibit transmission, of commands known to cause a fault in the system under test 130. Specifically, the mitigation techniques can include the configuration of devices or policies that prohibit the utilization, execution or processing of targeted derived grammar productions that may cause a fault in the system under test 130. As previously described, other mitigation techniques may be utilized.

Figure 1B:
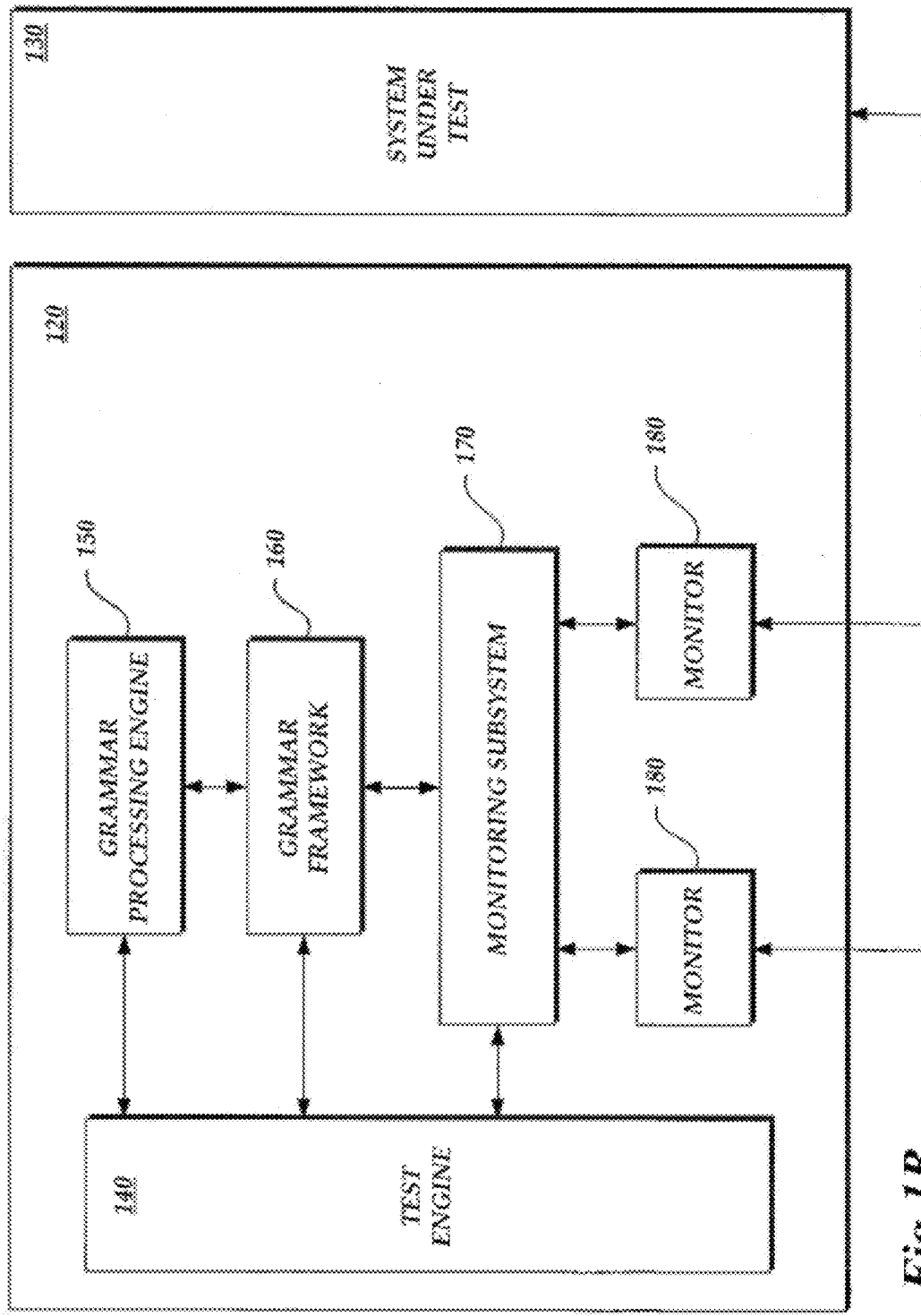
FIG. 1B illustrates exemplary components of the testing framework of FIG. 1A, according to an embodiment of the disclosure.

FIG. 1B illustrates exemplary components of testing framework 120, according to some embodiments of the disclosure. As depicted, testing framework 120 can include a test engine 140, a grammar processing engine 150, a grammar framework 160, and a monitoring subsystem 170. The test engine 140 may coordinate monitoring of the system under test 130, scheduling and managing of interdependencies between testing, launching of the tests, and recording of test results in, for example, a unified reporting structure.

Grammar processing engine 150 may receive results from tests run on system under test 130 from test engine 140. The results may include an actual output from system under test 130 that results from an input being applied to system under test 130. The actual output may be compared to an expected output to determine whether system under test 130 operates as expected. Grammar processing engine 150 can use the results to create a second set of one or more grammars by modifying or inserting tags, attributes, or annotations into one or more grammars of the first (original) set of grammars according to different strategies. Illustratively, the second set of one or more grammars corresponds to a new set of grammars that has been modified or generated from the original set of grammars and feedback associated with the outputs generated by the system under test 130. For example, grammar processing engine 150 may generate tag combinations that reveal faults. Further, grammar processing engine 150 can generate tags that reduce the total number of test cases generated by finding a smaller set of tags that reveal the already existing faults that have been exposed by the original set of grammars. Additionally, grammar processing engine 150 can perform a neighborhood search by, for example, generating grammars that create a new set of test cases near the original set of test cases.

The grammar framework 160 may typically include a grammar with attributes. The grammar with attributes may describe a set of one or more test cases. Of note, grammar framework 160 may parse the grammar and generate a set of test cases that can be run on the system under test 130. Further, grammar framework 160 can then execute the test cases on system under test 130 by sending one or more data packets corresponding to the test cases to the system under test. As shown, the results of the test cases can also be gathered by grammar framework 160 from system under test 130 to coordinate execution of the test cases.

As further illustrated, monitoring subsystem 170 receives results from executing the test cases on system under test 130. Monitoring subsystem 170 can then use one or more monitors 180 to correlate results from the execution of test cases with, for example, the health or status of the system under test 130. This may be advantageous for understanding the effects of test cases on, for example, available memory, processing resources, network response time, and other specific process functionality of system under test 130. Further, monitoring subsystem 170 allows the results of tests to be interpreted in a reliable, repeatable, and affordable manner.

Monitor 180 may use a variety of techniques to observe the environment or health of system under test 130 during testing, for example. As shown, there may be one or more types of monitors. Additionally, there can be one or more instances of each type of monitor 180 in a test environment. Monitors 180 may also correspond to external software or hardware components for observing the system 100 or system under test 130.

In an exemplary embodiment, monitor 180 may receive output from system under test 130 in real time, for example. This may be particularly helpful where the system under test 130 is a device controller. In this situation, a device that is operated by system under test 130 may exhibit normal behavior in response to an erroneous input from system under test 130, often the result of the device entering a fail safe mode. As a result, it may be improperly assumed that system under test 130 is operating correctly as well. A monitor 180 that examines the output of system under test 130, such as step function, would expose this flawed assumption, and can therefore be particularly advantageous for ascertaining whether the system under test 130 is actually functioning correctly. To determine whether the system under test 130 is performing as expected, for example, monitor 180 may compare the actual step function to an expected step function. A discrepancy between the step functions can indicate that a test case resulting from a grammar has exposed a fault of system under test 130.

Additionally, monitor 180 may be useful for determining network connectivity. For example, monitor 180 may determine whether system under test 130 is connected to a network or in communication with a device, such as a computer server running a component of testing framework 120. In this embodiment, monitor 180 may use internet control message protocol (ICMP) messages to determine whether the system under test 130 is connected to the network. Alternatively, monitor 180 can use an open connectivity interface to ascertain whether system under test 130 is communicating with other devices.

Figure 2:
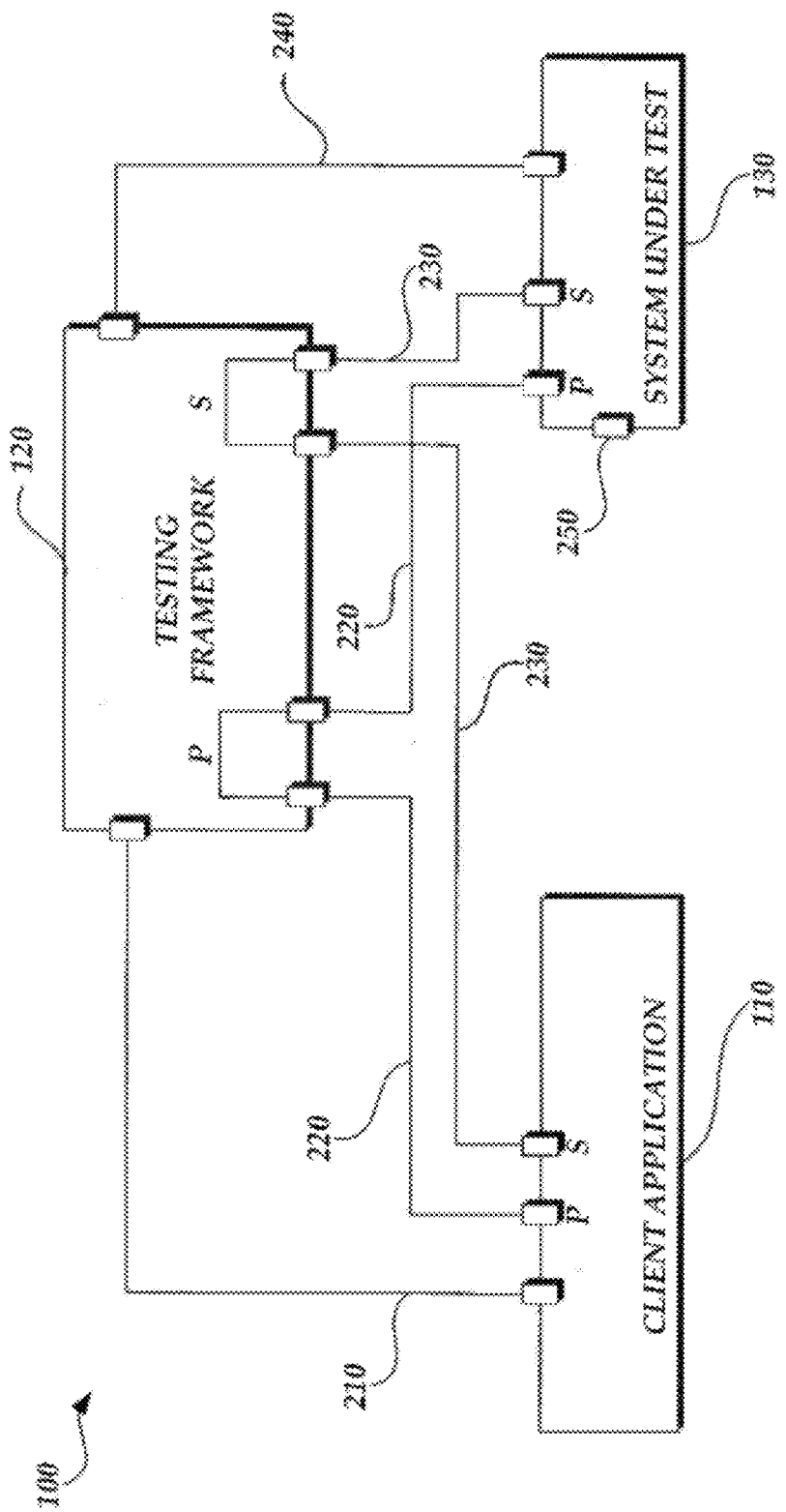
FIG. 2 illustrates a block diagram of the testing environment of FIGS. 1A and 1B illustrating the interconnection of inputs and outputs the exemplary components of the systems of FIGURES 1A and 1B.

With reference now to FIG. 2, the interconnection of inputs and outputs of the exemplary components of the systems of FIGS. 1A and 1B will be described. As illustrated in FIG. 2, the client application 110 (FIG. 1A) includes a first output 210 corresponding to a control signal generated by the client application. In an illustrative embodiment, the control signal corresponds to commands or other input generated by the client application 110 for implementing a testing sequence. The commands can be in accordance with the OPC communication standard.

The client application 110 also includes a primary output 220 and secondary output 230 for generating outputs to the system under test 130. As illustrated in FIG. 2, the primary and secondary output signals pass through the testing framework 120. In this capacity, the testing framework 120 serves as a communication bridge and can modify the input signals.

With continued reference to FIG. 2, the system under test 130 also includes various outputs 240 and 250 which can be routed to the testing framework 120. Outputs, such as outputs 240 and 250, can correspond to both digital and analog signals. For example, output 240 can correspond to a square wave output that can be monitored by the testing framework 120. Output 250 can correspond to USB interfaces for debugging by the client application 110 or other computing device. Output 250 can also correspond to an RS232 data interface for serially communicating additional information regarding the system under test 130. One skilled in the relevant art will appreciate that additional or alternative outputs and output types may also be routed and processed by the testing framework 120.

Figure 3:
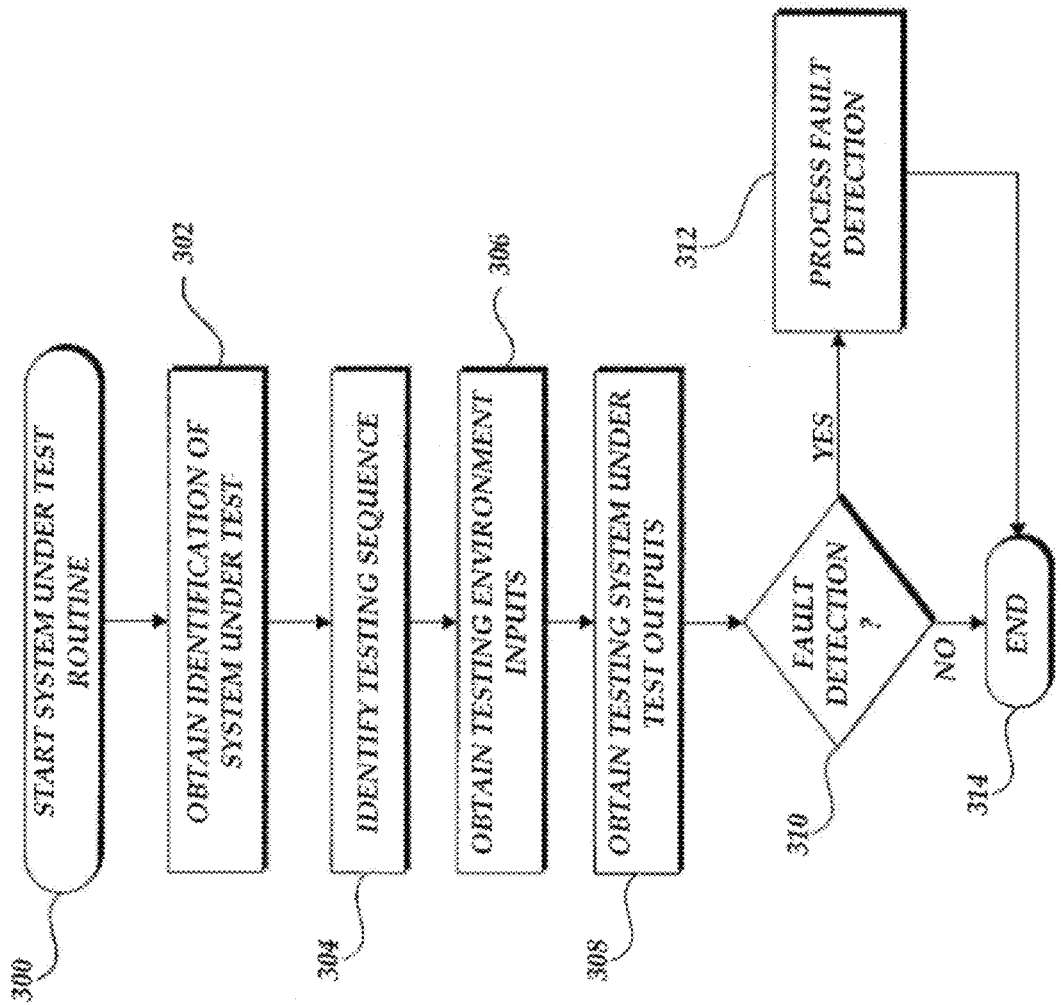
FIG. 3 illustrates a flow diagram illustration of a system under test testing routine performed by the exemplary components of the systems of FIGS. 1A and 1B, according to an embodiment of the disclosure

With reference now to FIG. 3, a routine for testing a system under test 130 will be described. At block 302, the testing framework 120 obtains an identification of the system under test 130. In an illustrative embodiment, the identification can correspond to a manual or automatic process, such as scanning bar codes, keying serial numbers, etc. At block 304, the testing framework identifies the testing sequence. In an illustrative embodiment, the testing sequence is generated by the grammar processing engine 150 (FIG. 1B) by processing various grammar attribute tags. The specific testing sequence may be based on the identification of the system under test 130 and/or additional user interaction. Additionally, in an illustrative embodiment, the testing sequence may correspond to various iterations of a testing grammar in which the results from a previous test of the system under test 130 is used to modify the testing grammar and/or create a new testing grammar.

At block 306, the testing framework collects testing environment inputs from the client application. As previously described, in an illustrative embodiment, the testing framework 120 functions as a communication bridge between the client application 110 and the system under test 130. At block 308, the testing framework obtains the outputs from the system under test 130. At decision block 310, a test is conducted to determine whether a fault has been detected.

In some embodiments, the client application 110 may send a new input instruction which is not properly serviced by the system under test 130. The system under test 130 may not recognize the input and/or understand the instruction. In some embodiments, because the existing state of the system under test 130 is "ON," the system under test 130 "fail-safe" response may be to assume that the instruction sent was to accomplish a change of state. For example, since the system under test 130 is "ON," the expected instruction is "OFF," and so the system under test 130 in "fail-safe" mode may switch the system under test 130 off, although the system under test 130 could not read and/or service (vulnerability) the "off" instruction.

In some embodiments, to an operator of the client application 110 it can seem that the system under test 130 is a properly functioning device since the "OFF" instruction produced the desired output, and it did in fact turn the system under test 130 "OFF," but that may be as an indirect result of a vulnerability, which hence may be overlooked by the testing operator. The client application 110 may be unaware that the system under test 130 was turned off by the "fail-safe" instructions rather than processing the particular input command. The failure to properly "service" the input command may be an error that indicates the presence of a vulnerability and/or "point of entry," that if not corrected, can be exploited, either accidentally and/or purposefully.

Another example where the client application 110 can indicate a system under test 130 is "secure" when it is not can be when instructions are sent to the system under test 130 at a high and/or irregular rate of speed. In this example, the system under test 130 vulnerability may be that it cannot "understand" and/or "service" input instructions at such rates of speed. This vulnerability can prevent the system under test 130 from servicing and/or responding to each individual instruction within the "storm of instructions." For example, the system under test 130 may be executing, for example, every fourth instruction to provide the predetermined result, such as switching to "OFF" and/or some other change of state.

For example, a system under test 130 error may result in the input instructions being ignored and/or "unserviced" by leaving the system under test 130 in its existing state and/or changing the system under test 130 output state in an erratic fashion with each test, thereby preventing the isolation and/or diagnosis of the fault (vulnerability) in the code. Examples of variations on the input instructions from expected can including delaying the sending on instructions, intentionally reordering instructions or corrupting some portion of the instructions. Advantageously, the testing framework 120 can receive real-time feedback while the system under test is servicing the input. In so doing, the operator can determine if an input instruction is serviced by the system under test 130 in the correct order.

In some embodiments, if the instruction is not serviced in the correct order, the testing framework can allow the client application 110 to identify the exact place and/or time of the system under test 130 fault rather than just traditionally looking at the output to see if it matches the predetermined state. The "place and/or time of fault" can be as useful as the fact that the output was incorrect. In some embodiments, the testing framework 120 can isolate the time and/or place of the vulnerability and/or determine that the vulnerability may be indicative that a code error and/or vulnerability may exist in the actual line of code servicing the input and/or in a close and/or related line of instructions.

In some embodiments, a real time testing framework 120 is provided to track and/or watch how the system under test 130 handles, executes, and/or services the input instructions. This provides several advantages over looking for the predetermined output to "confirm" that the system under test 130 is performing correctly, or incorrectly, as the case may be. Using the systems and methods provided, the actual error in the executable code can be determined and/or pinpointed. Further, the testing framework 120 can enable a tester to assess what is actually happening to the system under test 130 in real time and/or the "change of states" in the system under test 130. For example, the physical activity of the controller under test can be assessed and/or the implications of how the input is "serviced" by each system under test 130.

The testing framework 120 can define a model of expected behavior and/or compare the measured behavior to the model. In some embodiments, for example, a detection model based on a square wave output with a static frequency can be used. The frequency can be 1 Hz.

Anomalies can be detected by measuring the time between state transitions and/or comparing the value to the expected value of ½ the signal period:

$$\text{Error} = \text{time}_{current} - \text{time}_{last} / 0.5 * \text{period}$$

In some embodiments, if the measured value is not equal to the expected value, within a tolerance for error, and/or the difference exceeds thresholds defined by the user, then the appropriate warning and/or alarm is issued.

The detection model includes support for three fail-safe modes:
1) Last-value, where the system under test 130 can maintain the state of the output in the last state it was in.
2) High, where the system under test 130 may change the output state to 24V.
3) Low, where the system under test 130 may change the output state to 0V.

These three signal states can be detected as anomalies when the detection model is based on a periodic function because when the device enters fail-safe mode, the output rate of change becomes 0.

In some embodiments, the output signal of the system under test 130 can be a square wave with a period of 1 second. A model can specify that the voltage level read from the digital input should change state (from high to low and/or low to high), for example, every 500 milliseconds. Each time there may be a transition between logical states, it can calculate the time delta from the last recorded transition. In some embodiments, if the time delta between transitions does not equal the expected change plus or minus (+/−) an error margin, the behavior can be considered anomalous. The error margin can include, for example, latencies in the hardware and/or software of the system under test 130 and/or the discrete monitor limitations in timing accuracy, and/or the like. This can be represented by the following inequality:

$$\text{Expected\_Period} - \text{error} < \text{StateChangeTime}_{current} - \text{StateChangeTime}_{current-1} < \text{Expected\_Period} + \text{error}$$

Metrics such as the magnitude of the delta between missed transitions, either too long and/or two short, and/or the frequency of missed transitions can be applied to heuristics that help to automate the determination of whether the anomalous behavior is the device entering a predictable fail-safe mode. In some embodiments, the transitions can be checked for randomness and/or patterns in trend data can be observed to determine a behavior. If the behavior deviates from the model this may be considered a symptom of a possible software flaw.

Returning to FIG. 3, if a fault is detected at decision block 310, at block 312, the testing framework 120 processes the fault detection. In an illustrative embodiment, the fault is noted, such as in an error log. In another embodiment, the testing sequence may be terminated to prevent damage to the system under test 130 or other device. In still a further embodiment, the fault condition may be used as feedback to modify the testing grammar. For example, a noted fault may be utilized to generate additional test cases to determine the extent or scope of the identified fault or to focus the cause of the fault if multiple causes may be identified. In still a further embodiment, the fault condition may be used as feedback to identify the grammar production that generated the fault (e.g., the grammar production that generated the data causing the fault). The identified grammar production can then be utilized in the establishment of, or configuration of, mitigation techniques. If no fault is detected at decision block 310 or once the fault detection is processed at block 312, at block 314, the routine 300 terminates.

Exemplary Grammar Generation

Figure 4:
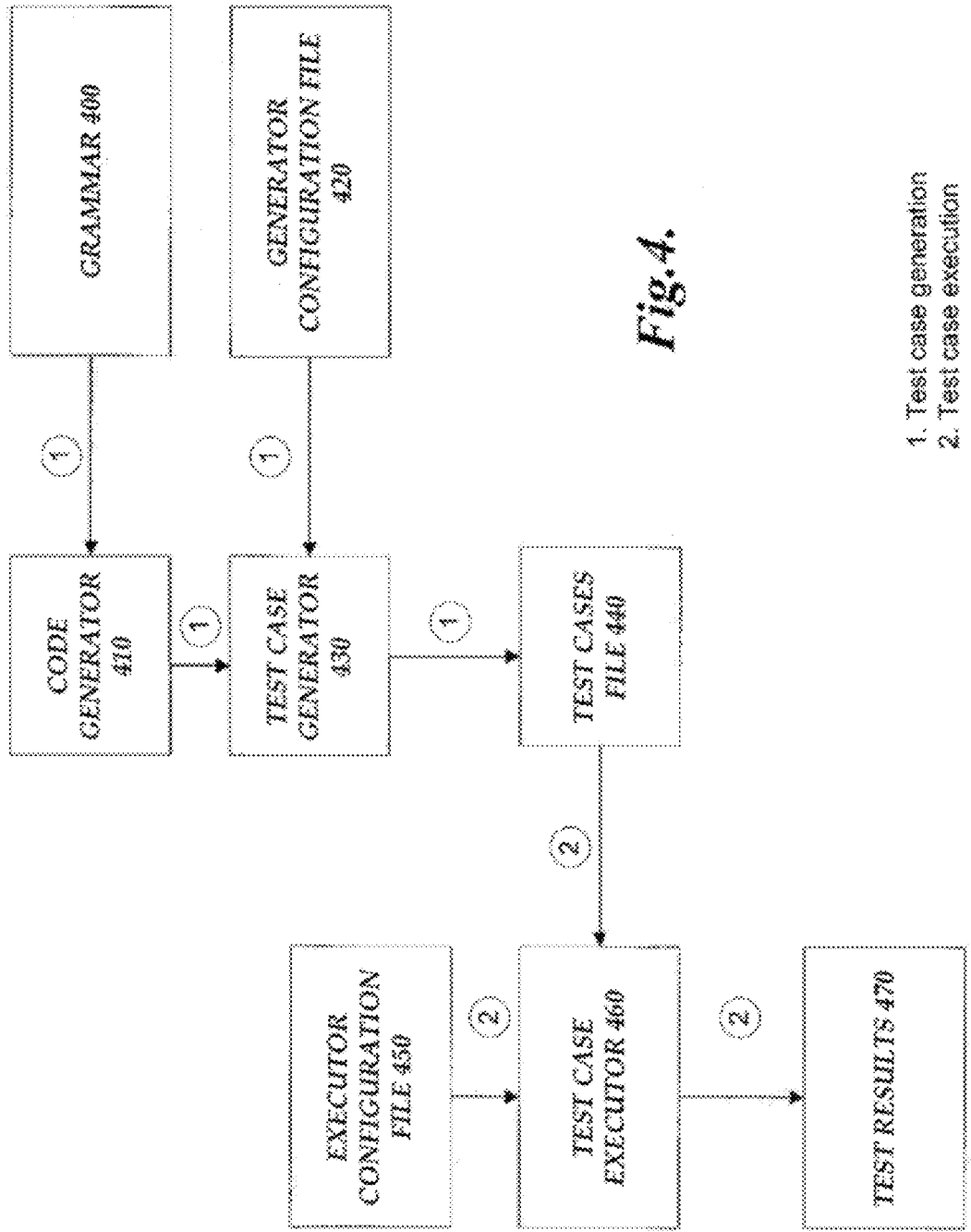
FIG. 4 illustrates a block diagram of the interaction of exemplary components of the grammar framework of FIG. 1B, according to an embodiment of the disclosure.

FIG. 4 is a block diagram illustrating the interactions of various components or aspects of the grammar framework 160 (FIG. 1B), according to an embodiment of the disclosure. In the embodiment of FIG. 4, the grammar framework 160 can include various components, such as a grammar 400, code generator 410, generator configuration file 420, and test case generator 430, which may be used to generate a test cases file 440. The grammar framework 160 may also include an executor configuration file 450 and test case executor 460, which can be used to execute test cases file 440 and obtain test results 470.

With continued reference to FIG. 4, an interaction of the components of the grammar framework 160 will be described with an illustrated embodiment. The grammar 400 and associated attributes or tags, along with corresponding tag values, can represent one or more test cases. The grammar 400 can then be passed as an input to code generator 410. Of note, although grammar 400 may initially be created manually by, for example, a software developer to describe an initial set of test cases, its subsequent modification may be completely automated by testing framework 120 using, for example, grammar processing engine 150.

The code generator 410 may parse grammar 400 and create test case generator 430. In an embodiment, test case generator 430 comprises an executable program. Test case generator 430 can be supplied with an initialization file, such as generator configuration file 420, which sets various configuration options and parameters for testing. For example, generator configuration file 420 may control the number and types of test cases that are generated by assigning values to grammar tags. Generation configuration file may be updated by grammar processing engine 150 to attempt different combinations of grammar tags in order to widen or constrict the test cases to, for example, find or pinpoint a cause of failure. When supplied with generator configuration file 420, test case generator 430 may then write out test cases that are described and/or can be derived by the grammar to the test cases file 440.

Test case executor 460 can read in the test cases file 440. Depending on the embodiment, test case executor 460 may also read in the executor configuration file 450, which may include information about system under test 130. This information can be used to set various options for testing system under test 130. One skilled in the relevant art will recognize that lexical analysis and/or parsing can both be used to process the information contained in test cases file 440 and executor configuration file 450. Test case executor 460 may then set any options specified by the executor configuration file 450 and execute the test cases in any order, report, and record the test results 470.

Figure 5:
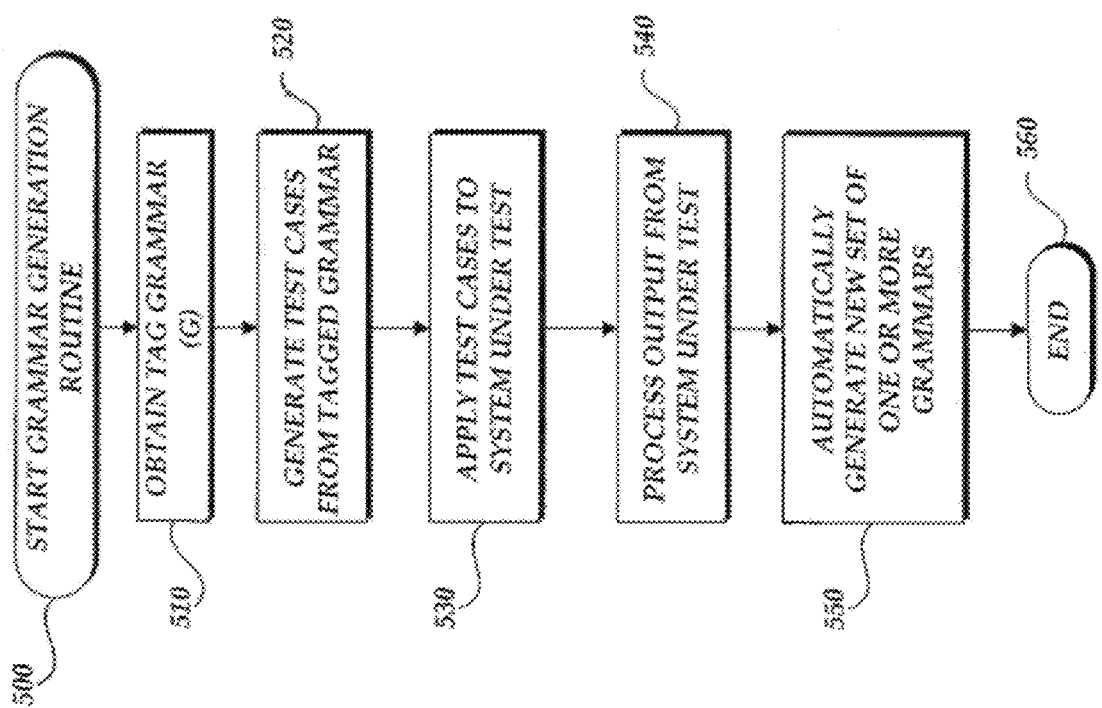
FIG. 5 illustrates a flow diagram illustration of a test case generation routine performed by the exemplary components of the systems of FIGS. 1A and 1B, according to an embodiment of the disclosure.

FIG. 5 illustrates a flow diagram of a test case generator routine 500 performed by the exemplary components of the systems of FIGS. 1A, 1B, and 2, according to an embodiment of the disclosure. For example, in some embodiments, this routine can be performed by components of testing framework 120, such as grammar processing engine 150. Depending on the embodiment, routine 500 may include fewer or additional blocks and blocks may be performed in an order that may be different than illustrated.

Beginning in block 510, an original grammar, G, is tagged with a set of one or more tags or attributes. In an embodiment, the grammar may further include corresponding tag values. The grammar may describe one or more test cases that can be run on, for example, system under test 130. The original grammar may initially be developed by, for example, a tester using a manual process. Alternatively, original grammar may be a grammar that was automatically created by, for example, grammar processing engine 150 to generate a set of test cases.

At block 520, an original set of test cases, such as, $T_1$, $T_2$, and $T_n$ are created from the original grammar. The original set of test cases can be generated by the grammar framework 160 described herein. In an embodiment, a parser can be used to generate the set of test cases that are described by the original grammar. Illustratively, a test case may be an event, action, or input, such as executable code, values, etc., that are applied to system under test 130. Typically, each test case has an expected result.

At block 530, the original set of test cases are applied to a system under test 130. For example, a set of input values can be supplied as input to system under test 130. As previously described, the system under test 130 may comprise any number of hardware components or may include software, such as an operating system or an application. In some embodiments, the system under test 130 may include a real time operating system, support various networking protocols and services, such as FTP, or have sparse resources.

The set of test cases may present situations that test various software or hardware configurations to determine open ports and vulnerable services residing on a system under test 130. Further, the set of test cases may check for flaws known to exist in the system under test 130. In an embodiment, the set of test cases may request a vast amount of resources to determine how the system under test 130 responds. Additionally, the set of test cases may be used to analyze network security by, for example, gathering network addresses, checking available services and protocols used, checking credentials for system under test 130; and selectively targeting and determining other vulnerabilities of the system under test 130.

At block 540, output from the system under test 130 is received using, for example, a network. The output may be analyzed by monitoring subsystem 170. As described above, monitoring subsystem 170 can quantify the effect of test cases on the system under test 130 by, for example, comparing the actual output from system under test 130 with the expected output for each test case. In some embodiments, one or more monitors 180 can be utilized to observe the system under test 130 during testing.

Continuing to block 550, a new, second, set of grammars is created that isolate causes of failure of system under test 130. The new set of grammars can be created by grammar processing engine 150 using the techniques described above. For example, tags of the original grammar may be modified, based on test case results, so that the resulting test cases apply input values within a narrower range to system under test 130. Alternatively, more grammars can be created that result in test cases that apply a wider range of input values to system under test 130. Of note, grammar processing engine 150 may use feedback from monitoring subsystem 170 to modify generator configuration file 420. The routine 500 ends at block 560.

In certain embodiments, the feedback may include pass or fail information after a test case has run. The feedback may be received by grammar processing engine 150 after a specified post test period has passed. This period of time may be the period needed for monitors 180 that were enabled to observe system under test 130 adequately and determine the effects of a test case. The feedback information may indicate a pass when the status of all or some monitors 180 remained normal during execution of the test case, which may indicate that the test case did not negatively impact the system under test 130. Alternatively, the feedback information may indicate a failure when the status of some monitors indicate a problem, such as a warning or alarm, during test case execution.

As noted, based on the feedback from test case execution, grammar processing engine 150 may modify generator configuration file 420 (FIG. 4). Generator configuration file 420 may then be used to create a second (new) set of test cases when grammar framework 160 is executed. Thus, the feedback information can be used to control and modify grammar tags to create a new set of grammars that search for faults of the system under test 130.

Of note, various tags can be used to automatically control the generation of test cases. In some embodiments, a tag that controls recursion by controlling the number of levels in a language tree corresponding to test cases can be generated by grammar processing engine 150. Further, a tag that controls balance by, for example, limiting the difference between path lengths in the language tree can be used. Additionally, a tag that uses rule weights can be employed to allow statistical control over the selection of rules with the same left hand side or nonterminal. In one embodiment, tags with covering arrays can be generated to allow combinatorial selection from the combinations generated by the right hand side of a rule, including terminal or nonterminal symbols. In some embodiments, general rule guards may be utilized to allow for activation and/or deactivation of rules based on a condition, such as a Boolean. Further, in an embodiment, embedded code that allows for the insertion of arbitrary software code that can be executed during test case generation or execution may be used.

All of the foregoing approaches may be utilized in the present disclosure to test a system that can include hardware or software. The tags and tag values disclosed can be selectively chosen by grammar processing engine 150 based on a testing strategy, such as a neighborhood search. For example, in some embodiments, the tags and tag values may be used to isolate one of a plurality of test cases that may have triggered a fault of the system. Further, the tags and tag values can be used to generate other test cases that are near test cases that reveal faults of the system. Thus, the automatic modification or insertion of grammar tags and tag values may greatly improve testing of the system.

Mitigation Techniques

Figure 6:
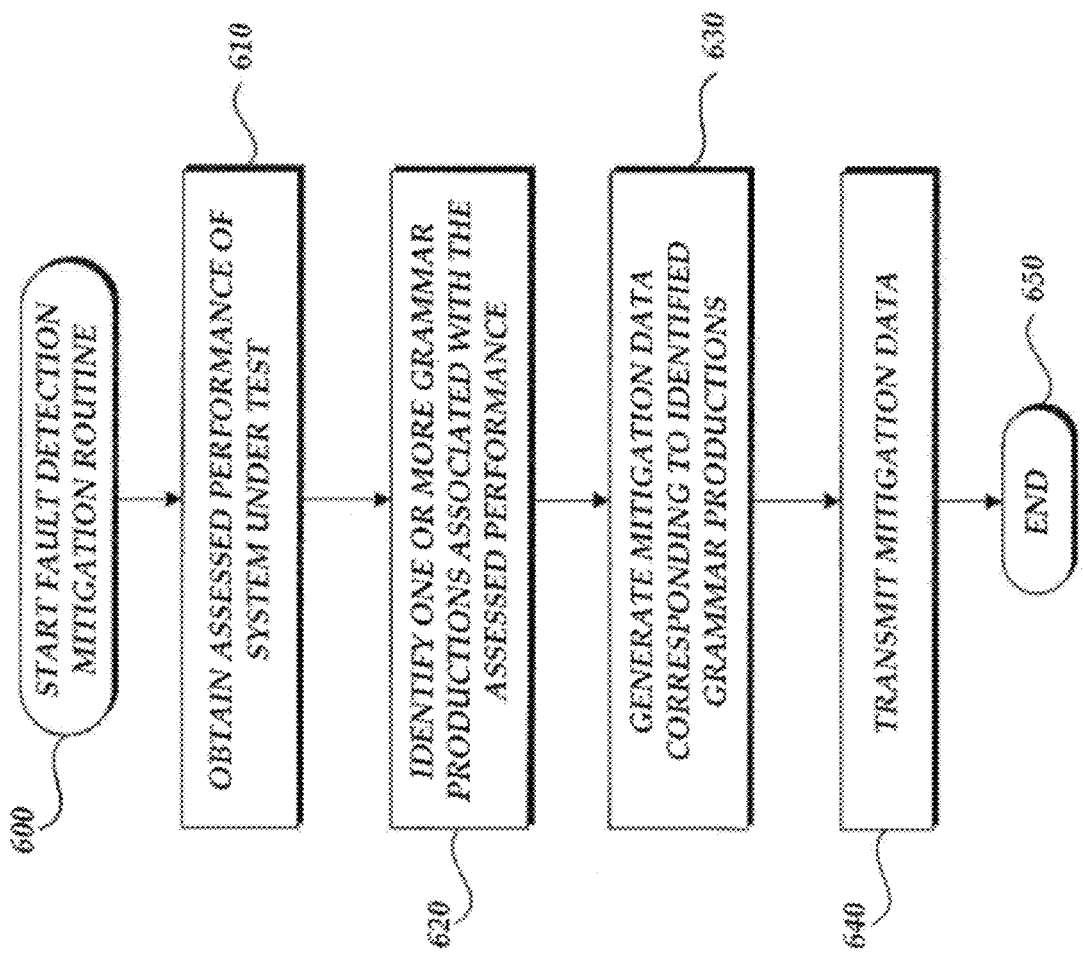
FIG. 6 is a flow diagram illustrative of a fault detection and mitigation routine implemented by the exemplary system of FIG. 1A.

With reference now to FIG. 6, a flow diagram illustrative of a fault detection mitigation routine 600 implemented by the mitigation component 135 of the exemplary system of FIG. 1A will be described. Although routine 600 will be described with regard to the mitigation component 135, all or portions of the routine 600 may be implemented by other components of the exemplary system 100. At block 610, the mitigation component 135 obtains an identification of the assessed performance for the system under test 130. As previously described with regard to block 312 (FIG. 3), the identification of the assessed performance of the system under test 130 can include the notation of fault conditions. At block 620, the mitigation component 135 processes the assessed performance information and identifies one or more grammar productions associated with the assessed performance. In an illustrative embodiment, the identification can include the specific grammar productions, individually or in combination, that may elicit a fault or other failure in the system under test 130. In other embodiments, the assessed performance can be general in terms of identifying one or more blocks of control instructions. Accordingly, the identification of one or more control instructions at block 620 can include an iterative process to isolate specific instructions that may elicit a fault. Additionally, in further embodiments, the mitigation component 135 may utilize probabilistic criteria or thresholds to determine the likelihood that particular control instructions may elicit a fault. Still further, the mitigation component 135 may attempt to transmit specifically identified control instructions to the system under test 130 in the hopes of verifying the particular effect of the identified control instructions.

An embodiment of this disclosure will now be described with reference to an instance of probabilistic criteria that may be utilized by the mitigation component 135 at block 620 to identify specific grammar productions that may elicit a fault or other failure in the system under test 130. Illustratively, such probabilistic criteria can be implemented as a Hidden Markov Model. In accordance with this embodiment, Gödel encoding is applied to encode sequences of grammar productions into natural numbers. Each basic element of grammar productions, i.e., non-terminal symbols, the arrow symbol, and terminal symbols is assigned a unique natural number. For example, the Ethernet/IP_Message, →, and 0000000001100101, would be assigned natural numbers respectively. Thus, up to this point a grammar production is represented as a sequence of l natural numbers, in which l is the number of actual elements the grammar production.

With continued reference to the illustrative embodiment, the Gödel encoding of the grammar production is the product of the first l prime numbers raised to their corresponding natural numbers in the sequence in question. Thus, the grammar production is represented as a single natural number, which in this disclosure can be referred to as the Gödel number of the grammar production. A sequence of grammar productions such as those found in a parse tree can be encoded in a similar fashion, yielding a natural number that in this disclosure is referred to as the Gödel number of the parse tree. The original sequence of grammar productions can be obtained by visiting the parse tree according to an algorithm such as Depth-First Traversal or Breadth-First Traversal. Once a tree traversal algorithm is chosen for use with this probabilistic approach, that specific algorithm may be maintained throughout the testing procedure. The Gödel number of a grammar production or parse tree is unique in that it represents no other grammar productions or parse trees. Moreover, the Gödel number of a grammar production or parse tree can be factored into prime numbers, and thus allow for recovering the original sequence of l natural numbers, which in turn can be reverted such as to produce that specific grammar production or parse tree.

With continued reference to an illustrative example, let t denote the time that elapses from 0 to the test duration. $s(t)$ is a function of time that indicates the state of the Hidden Markov Model at time t. Its state space is discrete and is comprised of two values, namely 'functional' and 'impaired'. Thus, the possible states of the Hidden Markov Model are 'functional' and 'impaired'. The Hidden Markov Model is in state 'functional' when the system under test 130 is not compromised by a test case. When a test case elicits a fault or other failure in the system under test 130, the Hidden Markov Model enters state 'impaired'. With regard to the state transition probabilities of the Hidden Markov Model, once the state 'impaired' is reached, in most systems under test an evolution into state 'functional' does not occur until full system restart. Thus, the probabilities that the Hidden Markov Model in state 'impaired' transitions into state "functional" and state 'impaired' are 0.0 and 1.0, respectively. The likelihood that the Hidden Markov Model in state 'functional' transitions into state "impaired" is random, and hence is governed by a discrete uniform distribution. The probabilities that the Hidden Markov Model in state 'functional' transitions into state "functional" and state 'impaired' are 0.5 and 0.5, respectively.

The low-level output of the Hidden Markov Model is comprised of messages of a network communication protocol generated by the system under test 130 in response to test cases. The Stochastic context-free grammar G1 to can be defined in the language L1 of that low-level output. Thus, language L1 encompasses both messages of a network communication protocol that are transmitted by system under test 130 when it does not experience a fault or other failure upon processing a test case, and messages of a network communication protocol transmitted by system under test 130 when it does experience a fault or other failure. Grammar G1 may be substantially different than the context-free grammar that is employed for generation of test cases. A Stochastic context-free grammar is a context-free grammar in which each production is assigned a probability. The overall probability of a sequence of terminal symbols that is the result of a derivation, i.e., is produced by a parse tree, is equal to the product of the probabilities of the productions that were used in that derivation. The probability of each production of grammar G1 represents the likelihood of that production contributing to a derivation that is indicative of the system under test 130 not experiencing a fault or other failure. Subtracting the probability of each production of grammar G1 from 1 yields the likelihood of that production contributing to a derivation that is indicative of the system under test 130 being impaired by a test case.

The probability of each sequence of terminal symbols, i.e. messages of a network communication protocol, that is recognizable by grammar G1 and hence lies in the language L1, is the probability that the sequence of terminal symbols in question is indicative of the system under test 130 not experiencing a fault or other failure. Subtracting that probability from 1 yields the probability that the sequence of terminal symbols in question is indicative of the system under test 130 experiencing a fault or other failure. The parse tree, which relates to the recognition by grammar G1 of a message of a network communication protocol generated by the system under test 130 in response to a test case, is encoded into a Gödel number. Such Gödel numbers serve as observations in the Hidden Markov Model. o(t) is a function of time that indicates the observed Gödel number in the Hidden Markov Model, i.e., the Gödel number of the parse tree that performs the derivation of a message transmitted by system under test 130 in response to a test case and recognized by grammar G1, at time t. The emission probabilities in the Hidden Markov Model are constructed from the probabilities of response messages as recognized by grammar G1. Thus, for each point in time from 0 to the test duration, the Hidden Markov Model presents a Gödel number that suggests the hidden state is 'functional' with probability p, and 'impaired' with probability q=1−p.

A Viterbi algorithm may be applied to determine probabilistically on the basis of observed Gödel numbers as reconstructed via language recognition, whether s(t) ever entered hidden state "impaired" throughout the duration of the test. In other words, we can leverage the Viterbi algorithm to obtain the most likely sequence of hidden states that were reached by the Hidden Markov Model throughout the duration of the test. If the sequence of such hidden states, which is otherwise referred to as a Viterbi path, includes hidden state "impaired", then a test case is most likely to have elicited a fault or other failure in the system under test 130. If that is the case, we proceed with the identification of the parse tree or production that derived the test case which is the origin of the fault or other failure. The Viterbi algorithm produces a Viterbi path that corresponds to time. In other words, the time at which the Hidden Markov Model entered hidden state "impaired" for the first time is available from the Viterbi path. That specific time is usable in determining the specific test case that elicited a fault or other failure in the system under test 130, and thus the specific parse tree or specific production which that test case was derived from. The response generated by the system under test 130 upon processing a test case may be null, i.e., no messages. In some cases a lack of response from the system under test 130 may be a clear indication of a fault, while in other cases it may represent protocol compliant behavior. A lack of response may be incorporated into the output of the Hidden Markov Model and be assigned a probability of indicating that system under test 130 is not experiencing a fault or other failure. Subtracting that probability from 1 returns the probability that the system under test 130 is experiencing a fault or other failure.

At block 630, the mitigation component 135 generates mitigation data corresponding to the identified control instructions. As previously identified, in one embodiment, the mitigation data can correspond to configuration information for configuring devices, such as a firewall. More specifically, the configuration information can correspond to the configuration of the device to prevent the transmission of the identified control instructions to the system under test 130. Such configuration information can correspond to a selection of filters, filter values, previously generated configurations, and the like. The configuration information is the grammar production that produced the fault. The identified grammar production can be used to generate the configuration information. Specifically, various computing devices can be programmed or configured to identify the grammar production. The computing devices can then be further programmed and configured to take appropriate steps to block the execution of the production grammar (e.g., prevent the generation of data that would create a fault), initiate notification procedures, initiate additional logging or documentation procedures, initiate additional testing procedures and the like. Additional or alternative mitigation techniques may also be implemented by the mitigation component 135.

At block 640, the mitigation component 135 transmits the mitigation information to various components for further processing or implementation. In an illustrative embodiment, the mitigation component 135 can contemporaneously configure computing devices with the mitigation information to allow for an automatic mitigation of a system under test. In another embodiment, the mitigation component 135 can transmit the mitigation to a publication entity for distribution of the mitigation data to additional recipients. At block 650, the routine 600 terminates.

While illustrative embodiments have been disclosed and discussed, one skilled in the relevant art will appreciate that additional or alternative embodiments may be implemented within the spirit and scope of the present disclosure. Additionally, although many embodiments have been indicated as illustrative, one skilled in the relevant art will appreciate that the illustrative embodiments do not need to be combined or implemented together. As such, some illustrative embodiments do not need to be utilized or implemented in accordance with the scope of variations to the present disclosure.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art. It will further be appreciated that the data and/or components described above may be stored on a computer-readable medium and loaded into memory of the computing device using a drive mechanism associated with a computer-readable medium storing the computer executable components, such as a CD-ROM, DVD-ROM, or network interface. Further, the component and/or data can be included in a single device or distributed in any manner. Accordingly, general purpose computing devices may be configured to implement the processes, algorithms, and methodology of the present disclosure with the processing and/or execution of the various data and/or components described above. Alternatively, some or all of the methods described herein may alternatively be embodied in specialized computer hardware In addition, the components referred to herein may be implemented in hardware, software, firmware or a combination thereof It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A testing apparatus comprising:
   a communication component operative to transmit control instructions to a computing device, wherein the control instructions are generated based, at least in part, on a testing grammar;
   a device output component operative to obtain an output from the computing device, wherein the output from the computing device is responsive to the control instructions transmitted by the communication component;
   a data processing component for assessing computing device functionality based on a comparison of the control instructions and the output from the computing device; and
   a mitigation component for causing the performance at least one mitigation technique corresponding to the assessed computing device functionality from the data processing component, the mitigation technique utilized to limit the assessed computing device functionality.

2. The testing apparatus as recited in claim 1, wherein the device output component is further operative to obtain additional outputs generated by the computing device.

3. The testing apparatus as recited in claim 1, wherein the control instructions correspond to at least one of internet control message protocol messages and a set of test cases generated by the client application.

4. The testing apparatus as recited in claim 3 further comprising a grammar engine component for generating the set of test cases based on processing the testing grammar.

5. The testing apparatus as recited in claim 1, wherein the data processing component is further operable to identify a grammar production associated with the control instructions.

6. The testing apparatus as recited in claim 5, wherein the mitigation component is operable to cause the performance of at least one mitigation technique associated with the identified grammar production.

7. The testing apparatus as recited in claim 1, wherein the communication component includes a first bridge component operative to bridge control instructions transmitted from a client application over a primary control channel.

8. The testing apparatus as recited in claim 7, wherein the communication component further includes a second bridge component operative to bridge control instructions transmitted from the client application over a secondary control channel.

9. The testing apparatus as recited in claim 1, wherein the mitigation technique corresponds to the configuration of a device to prevent at least one of transmission or execution of one or more control instructions corresponding to the assessed computing device functionality.

10. The testing apparatus as recited in claim 9, wherein the device is a firewall component.

11. A system for testing computing devices, comprising:
    a testing component for transmitting control instructions to the device under test, and obtaining at least one output generated by the device under test, wherein the at least one output generated by the device under test is responsive to the control instructions; and
    a mitigation component for generating at least one mitigation technique based on device performance, the device performance assessed on an analysis of a fault generated by the control instructions and the at least one output generated by the device under test, wherein the at least one mitigation technique corresponds to prevention of the processing of control instructions associated with the assessed fault generated by the control instructions.

12. The system as recited in claim 11, wherein the mitigation technique corresponds to the prevention of transmission of one or more control instructions corresponding to the assessed device performance.

13. The system as recited in claim 12, wherein the prevention of transmission of one or more control instructions corresponds to the configuration of a computing device to prevent transmission of the control instructions to the device under test.

14. The system as recited in claim 11 further comprising a test case generation component operative to generate a set of test cases from a test grammar, wherein the control instructions correspond to at least a subset of the set of test cases.

15. The system as recited in claim 14, wherein the test grammar includes a set of attributes.

16. The system as recited in claim 15, wherein the test generation component generates the set of test cases based on processing the attributes in the test grammar.

17. The system as recited in claim 11, wherein the client application component transmits control instructions over a first and second channel.

18. The system as recited in claim 17, wherein the testing component includes a first communication port for obtaining control instructions from a client application over a first communication channel and for transmitting control instructions to the device under test over the first communication channel.

19. The system as recited in claim 18, wherein the testing component includes a second communication port for obtaining control instructions from the client application over a second communication channel and for transmitting control instructions to the device under test over the second communication channel.

20. The system as recited in claim 11, wherein the analysis of the fault generated by the control instructions and the at least one output generated by the device under test includes a comparison of the at least one output based on a rate of transmission of the control instructions.

21. The system as recited in claim 20, wherein the comparison of the at least one output based on a rate of transmission of the control instructions corresponds to a comparison of the at least one output based on a change in the rate of transmission of the control instructions.

22. The system as recited in claim 20, the comparison of the at least one output based on a rate of transmission of the control instructions corresponds to a comparison of the at least one output based on a variation of the rate of transmission of the control instructions.

23. The system as recited in claim 11, wherein the analysis of the fault generated by the control instructions and the at least one output generated by the device under test corresponds to a comparison of the at least one output generated by the device under test according to a specific order of control instructions.

24. The system as recited in claim 23, wherein the comparison of the at least one output includes a determination of a transition of the output signal from a first state to a second state.

25. The system as recited in claim 24, wherein the determination of a transition of the output signal from a first state to a second state includes a time required to achieve the transition from the first state to the second state.

26. The testing apparatus as recited in claim 11, wherein the mitigation component is further operable to identify a grammar production associated with the control instructions.

27. The testing apparatus as recited in claim 26, wherein the mitigation component is operable to cause the performance of at least one mitigation technique associated with the identified grammar production.

28. The testing apparatus as recited in claim 26, wherein the mitigation component is further operable to identify the grammar production associated with the control instructions based, at least in part, on one or more probabilistic criteria.

29. The testing apparatus as recited in claim 28, wherein the one or more probabilistic criteria are implemented as a Hidden Markov Model.

30. A method for testing comprising:
obtaining at least one output from a system under test;
assessing performance of the system under test based on an analysis of at least one control instruction transmitted to the system under test and the at least one output, wherein the at least one control instruction is generated from grammar productions; and
performing at least one mitigation technique responsive to the assessed performance of the device, wherein the mitigation technique is derived, at least in part, from the grammar productions associated with control instructions generating a fault in the system under test.

31. The method as recited in claim 30, wherein obtaining at least one output from the device under test includes obtaining a square wave output from the device under test.

32. The method as recited in claim 30, wherein assessing performance of the device under test based on an analysis of the at least one control instruction and the at least one output includes comparing the at least one output with a rate of transmission for a set of control instructions.

33. The method as recited in claim 30, wherein performing at least one mitigation technique responsive to the assessed performance of the device includes preventing at least one of transmission or execution of one or more control instructions corresponding to the assessed computing device functionality.

34. The method as recited in claim 30 further comprising generating the at least one control instruction.

35. The method as recited in claim 34, wherein generating the at least one control instruction includes obtaining a test grammar including one or more testing attributes and generating the at least one control instruction from the test grammar.

36. The method as recited in claim 30 further comprising transmitting the at least one control instruction to the device under test over a primary communication channel.

37. The method as recited in claim 36 further comprising transmitting the at least one control instruction to the device under test over a secondary communication channel.

38. The method as recited in claim 30, wherein assessing performance of the device under test based on an analysis of the at least one control instruction and the at least one output includes monitoring the at least one output with an order of a set of control instructions.

39. The method as recited in claim 38, wherein monitoring the at least one output includes monitoring a state transition from a first state to a second state.

40. The method are recited in claim 39, wherein monitoring the at least one output further includes monitoring a time associated with the state transition from the first state to the second state.

* * * * *